United States Patent [19]

Lewis et al.

[11] 4,038,567
[45] July 26, 1977

[54] MEMORY INPUT SIGNAL BUFFER CIRCUIT

[75] Inventors: Scott Clarence Lewis, Essex Junction; Theodore Milton Redman, Williston; James Edward Rock, Milton; Donald Lawrence Wilder, Colchester, all of Vt.

[73] Assignee: International Business Machines Corporation, Armonk, N.Y.

[21] Appl. No.: 669,012

[22] Filed: Mar. 22, 1976

[51] Int. Cl.² .................. H03K 5/20; H03K 5/18; H03K 3/286; H03K 3/353

[52] U.S. Cl. .................... 307/362; 307/355; 307/270; 307/279; 307/DIG. 1; 307/DIG. 3; 307/DIG. 4

[58] Field of Search .......... 307/221 C, 221 D, 235 F, 307/235 T, 279, 304, DIG. 1, DIG. 3, DIG. 4, 208, 264; 340/173 R

[56] References Cited

U.S. PATENT DOCUMENTS

| 3,639,787 | 2/1972 | Lee | 307/DIG. 1 X |
| 3,760,381 | 9/1973 | Yao | 307/DIG. 3 X |
| 3,835,457 | 9/1974 | Yu | 307/DIG. 1 X |
| 3,891,977 | 6/1975 | Amelio et al. | 307/DIG. 3 X |
| 3,892,984 | 7/1975 | Stein | 307/279 |
| 3,949,381 | 4/1976 | Dennard et al. | 307/279 X |
| 3,959,781 | 5/1976 | Mehta et al. | 307/279 X |

OTHER PUBLICATIONS

Jacobson et al., "Memory Bit Driver"; IBM Tech. Discl. Bull.; vol. 15, No. 6, pp. 1734–1735; 11/1972.
Furman et al., "Sense Latch Circuit for Memory Cells", IBM Tech. Disc. Bull.; vol. 16, No. 9; pp. 2792–2793; 2/1974.

Primary Examiner—John S. Heyman
Assistant Examiner—Larry N. Anagnos
Attorney, Agent, or Firm—Howard J. Walter, Jr.

[57] ABSTRACT

A memory input signal dynamic logic buffer circuit for providing FET level complementary output signals in response to low level input signals. The circuit is compatible with a variety of bipolar transistor driving logic families as the input signal sensitivity may set external to the circuit. The circuit includes a cross-coupled dynamic latch responsive to gated input and reference signals. Voltage boosting capacitors coupled to the latch nodes provide for simultaneous setting of the latch and boosting of the output nodes, which are connected to dynamic output driver circuits.

19 Claims, 2 Drawing Figures

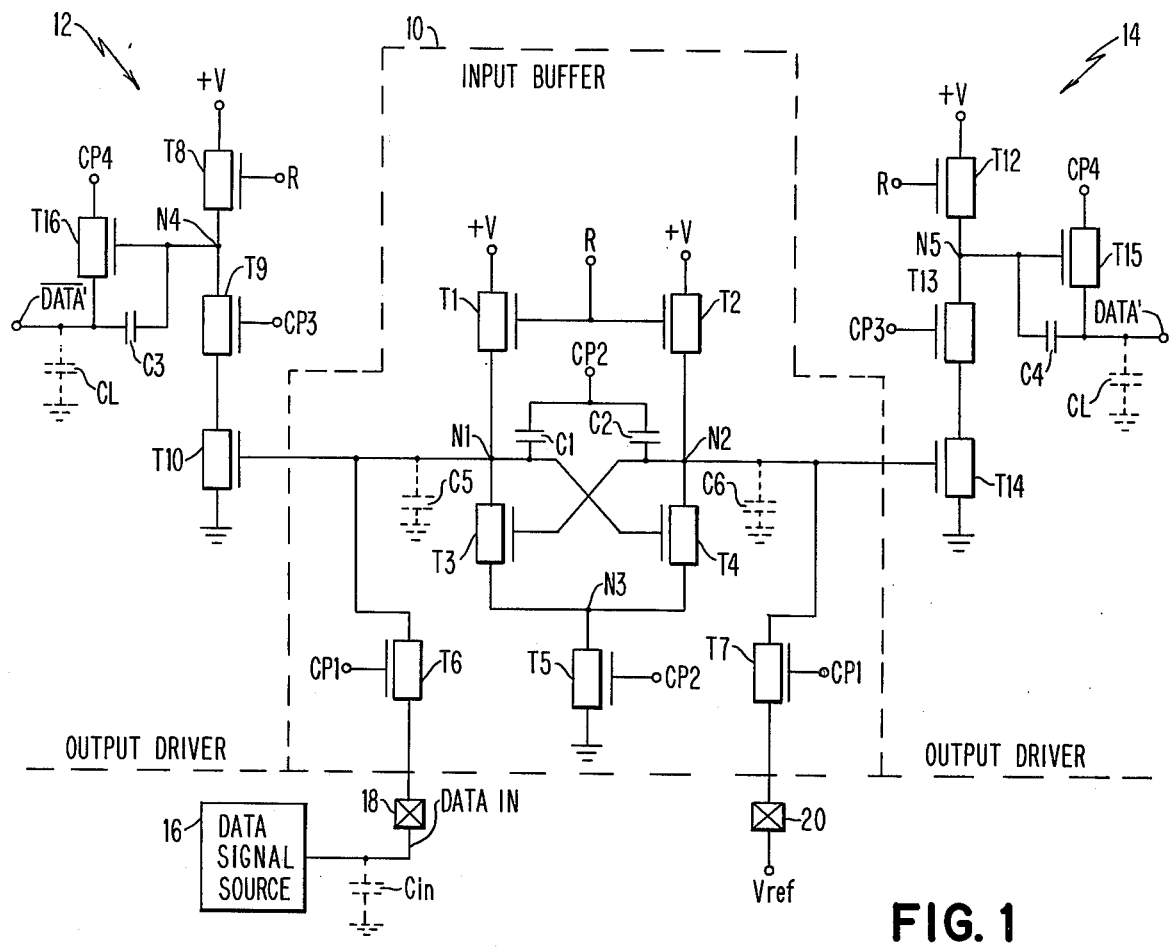
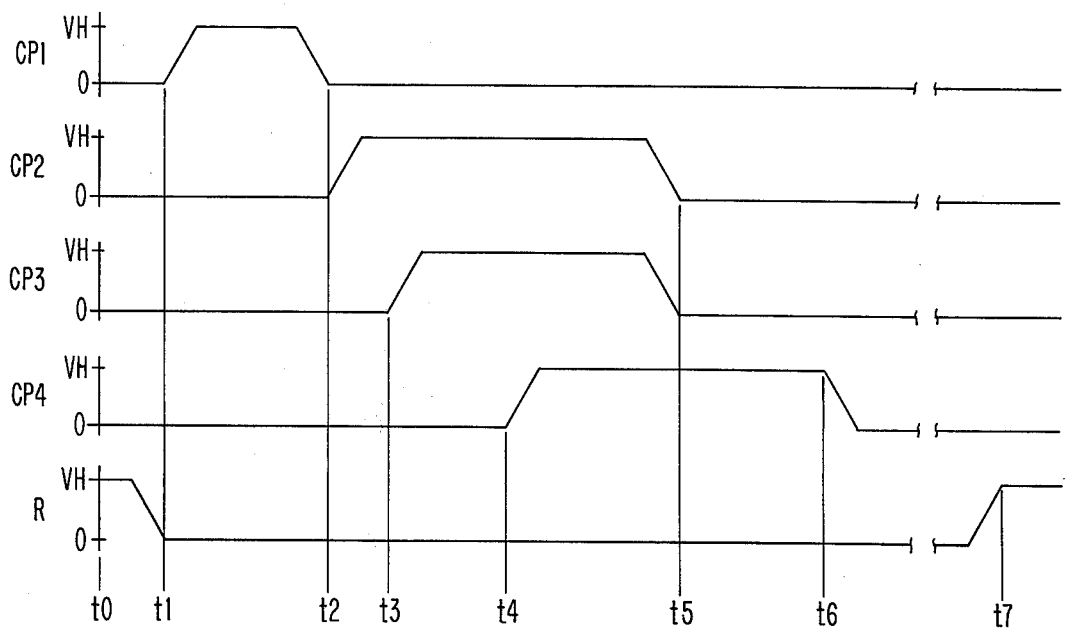
FIG. 1
FIG. 2

MEMORY INPUT SIGNAL BUFFER CIRCUIT

BACKGROUND OF THE INVENTION

1. Field of the Invention

This invention relates to semiconductor memory systems and particularly to peripheral logic support circuits for providing true and complement logic signals in response to externally applied information signals.

2. Description of the Prior Art

An interface or buffer circuit is required in many electronic systems using semiconductor integrated circuits for charging the voltage levels of logical "ones" and "zeros" developed by one logic system connected to its input to the voltage levels required by another logic system connected to its output. For example, in the application of semiconductor memory systems for use in computers and other products it has become preferable to utilize field-effect transistor (FET) memory systems coupled to bipolar transistor logic systems.

In the past it was possible to design both FET and bipolar circuits in which logic levels were directly compatible without the need for voltage level buffering. In early FET memory systems, all required information and clocking signals were generated by external bipolar circuitry and applied directly to an FET memory array chip. Improvements in FET processing enabled FET storage density to increase to the point that input/output connections to an FET memory chip became to numerous to utilize effectively. Reduction in the memory of input/output connections was achieved by providing peripheral logic circuits located on the memory chips to generate those necessary signals which were easily derived from a minimum of externally provided information signals. For example, although the decoding of memory addresses requires both true and complement signals, a single input can be inverted on the memory chip to provide the complement. Prior art techniques included the use of the bipolar true signal directly and used a logical inverter to generate the complement, see for example, the article, "MOSFET Low-Power Inverter", by J. C. Hsieh et al, *IBM Technical Disclosure Bulletin*, February 1971, page 2660. Additional techniques included the use of cascaded inverters having their outputs coupled to separate driver circuits, such as shown in U.S. Pat. No. 3,796,893 to Hoffman et al.

Additional advancement in the state of the art produced highly efficient FET and bipolar circuit technologies which used incompatible voltage levels for their logical signals. It became necessary not only to provide all of the logical signals to the memory array but also to translate generally lower bipolar logic signal levels to the relatively higher FET logic signal levels. Although translating from negative bipolar signals to positive FET signals could be achieved by interconnecting power supply terminals, problems still remain. One common problem was that, although sufficient logical one, or up levels, could be provided by bipolar circuits, in many cases the logical zero, or low level, was often insufficiently low to completely turn off an input FET. Prior art techniques for insuring FET circuit response under such conditions include the use of ratioed inverters, such as described in U.S. Pat. No. 3,594,736 to Hoffman and U.S. Pat. No. 3,898,477 to Buchanan. Such solutions are undesirable as they require the use of large amounts of DC power and unnecessarily increase the input capacitance which the bipolar signal must drive. The use of an input circuit including a common gate FET amplifier, such as described in the article, "FET Input Circuit", by T. L. Palfi, *IBM Technical Disclosure Bulletin*, June 1971, page 240 or in U.S. Pat. No. 3,076,700 to Buchanan, can reduce input capacitance.

Additional techniques useful to render bipolar signals compatible with FET input requirements include the use of a source bias potential to effectively increase FET threshold voltage, see U.S. Pat. No. 3,678,293 to Popper or U.S. Pat. No. b 3,848,237 to Geilhufe et al. The use of unstable or unbalanced cross-coupled latch circuits has been proposed in U.S. Pat. Nos. 3,778,784 to Karp et al, 3,795,898 to Mehta et al, and 3,902,082 to Proebsting et al. In such input buffers a cross-coupled latch circuit is initially set in a stable state such that the state will be reversed only in the event that a high level bipolar signal is applied to one side of the latch.

Still further variations may be found in U.S. Pat. No. 3,787,736 to Chin, which describes a circuit in which a high level bipolar signal and a power supply potential are simultaneously gated to a pair of cross-coupled FET ratioed inverters having their outputs coupled to true and complement driver circuits.

Various combinations and modifications of the above prior art techniques have been previously suggested in an effort to increase circuit performance. For example, capacitive voltage boosting techniques, such as taught by U.S. Pat. No. 3,480,796 to Polkinghorn et al, have been implemented in address buffer output drivers. See, for example, U.S. Pat. No. 3,906,463 to Yu.

Although the prior art has provided solutions to many problems found in the past, continued improvement of both bipolar and FET circuitry has created additional problems for which prior art techniques are not ideally suited. For example, many buffer circuits must be specifically designed for a particular type of input signal, such that the FET memory chip has no compatibility with respect to other logic systems. Some circuits are preferable for logic systems in which the high level input is too low, others are preferable where the low level input is not low enough to provide full FET logic level output signals.

SUMMARY OF THE INVENTION

It is therefore an object of this invention to provide an improved input signal buffer circuit which is capable of translating various types of input signals to FET compatible logic signals.

It is another object to provide an input signal buffer circuit which is relatively insensitive to noise on the input signal lines.

It is a further object to provide an input signal buffer capable of providing FET level output signals in response to input signals having maximum amplitudes of less than the threshold of FET devices.

These and other objects, and advantages, are achieved by the subject invention through the use of a dynamic cross-coupled FET latch circuit in which an input signal and a reference potential are gated to the precharged output nodes of the latch circuit followed by the capacitive coupling of a clock pulse to the output nodes to simultaneously provide a sufficient signal to set the latch and drive the output drivers.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 1 is a schematic circuit diagram of an input signal buffer according to the principles of the invention.

FIG. 2 is a timing diagram illustrating a typical pulse program sequence for operating the circuit of FIG. 1.

DESCRIPTION OF THE PREFERRED EMBODIMENT

Referring to FIG. 1 there is shown a schematic diagram of the memory input signal buffer circuit including an input buffer 10 and output drivers 12 and 14. Input buffer 10 is responsive to data pulses supplied by Data Signal Source 16 which is connected to the memory chip DATA IN pad 18. Data Signal Source 16 may be any of the many typical data, address or command signal sources used to provide logical information signals to an FET memory circuit. The data signals represent zero and one logic levels are preferably of positive polarity with respect to the FET logic levels when used in conjunction with n-channel FET circuitry, although negative polarity data signals may also be used under some circumstances. The voltage levels of the data input or information signals may vary over a considerable range without effecting the operability of the buffer circuit. For example, the logical one or up level of the input may be above or below the threshold voltage for FETs used in the buffer circuitry. In addition, should the logical zero or down level of the input exceed the FET threshold voltage, the circuit is still operable. Also provided as a second input to input buffer 10 is a reference potential Vref which is preferably supplied externally through chip pad 20, but which may be generated internally. The potential level of Vref is selected to be preferably half-way between the expected worse case up and down levels of the bipolar input signals, e.g., logical ones and zeros. The output of the circuit in FIG. 1 provides true and complement output signals on terminals DATA' and $\overline{DATA'}$. Internal to input buffer 10 are n-channel FET precharge devices T1 and T2, the gates of which are connected to a restore pulse R. T1 and T2 have their drain electrodes coupled to a source of positive supply +V and their sources are respectively coupled to voltage nodes N1 and N2. A pair of cross-coupled devices, T3 and T4 are provided with the drain of T3 and the gate of T4 connected to node N1 and the drain of T4 and the gate of T3 connected to node N2. The source electrodes of T3 and T4 are commonly connected to the drain of T5 establishing voltage node N3. The gate of T5 is connected to be responsive to a second clock pulse CP2, while the source of T5 is connected to a negative source of reference potential with respect to +V, for example, ground potential. The DATA IN pad 18 is coupled to node N1 by a gating device T6 which is responsive to a first clock pulse CP1. Reference potential Vref is similarly coupled to node N2 by way of pad 20 and CP1 responsive gating device T7. A first voltage coupling means, capacitor C1, is also connected between node N1 and clock pulse CP2. A similar second voltage coupling means, capacitor C2 is connected between node N2 and CP2.

The outputs of input buffer 10, nodes N1 and N2, are connected to the inputs of a pair of identical output drivers 12 and 14. Although a variety of output driver circuits may be used in conjunction with input buffer 10, only a single preferred embodiment is shown. Output driver 12 comprises a ratioless dynamic inverter stage including input responsive transistor T10 having its source connected to ground reference potential and its drain connected to the source of gating transistor T9. The gate of T9 is responsive to third clock pulse CP3. The drain of T9, corresponding to voltage node N4, is connected to the source of precharge transistor T8, which has its drain connected to supply potential +V and its gate connected to restore pulse R. Connected to node N4, corresponding to the output of the inverter, is a boot-strapped source follower amplifier comprising T16 and capacitor C3. The drain of T16 is coupled to a fourth clock pulse CP4 which is selectively gated through T16 in the presence of a logical one on voltage node N4. Capacitor C3, connected between the source of T16 and its gate, provides regenerative feedback and enables the full potential of CP4 to appear on output terminal $\overline{DATA'}$. Output driver 14 is identical to driver 12 and is responsive to the potential on node N2, as opposed to N1. Driver 14 comprises transistors T12, T13, T14 and T15 and bootstrap capacitor C4 and provides an output signal on output terminal DATA'.

In order to obtain optimum performance, a number of additional distributed and parasitic capacitances must be taken into consideration. In application such as address buffers, the input data signal supplied by Data Signal Source 16 may be provided to a large number of memory chips in parallel. The number and length of the lines carrying the input signal will have associated with it a considerable distributed capacitance, Cin, which will effect the input signal response time. In many prior art buffer circuits, input signals are applied to the gate electrodes of one or more devices, thereby increasing the effective capacitance of Cin. In the subject circuit input capacitance at the memory chip is minimized by applying the input signal directly to the source diffusion of the input gating device T6. Another benefit of applying the input signal to a diffusion rather than a gate electrode is that no gate protect circuitry is required on the FET memory chip saving valuable chip area as well as reducing the input capacitance. In many applications the number and size of the line driven by the outputs of the circuit is large and corresponds to a considerable load capacitance CL. The use of the buffer circuit effectively allows a minimum input capacitance information signal to drive a large load capacitance CL. Internal to the buffer and driver circuits are various parasitic capacitances, not all of which are identified, which effect the speed or performance of the circuit. For example, parasitic capacitor C5 corresponds to the total capacitance of node N1 and includes the capacitance of the source of T1, the drain of T3, the gate of T4 and the gate of T10. As can be seen from FIG. 1, C6 is the corresponding parasitic capacitance of node N2. Both C5 and C6 should be minimized as they determine the required size of coupling capacitors C1 and C2, as the change in voltage induced on N1, for example, when CP2 rises from ground to VH, ideally equals VH(C1/(C1+C5)).

Referring now to FIG. 2 there is shown a typical pulse program for the operation of the circuit in FIG. 1. Time t0 represents a point in a memory cycle just prior to the access of the memory chip and times t1-t7 represent various points in time after the access cycle begins. All of the clock pulses CPn correspond to signals preferably generated on the memory chip to achieve maximum performance. The pulses all have a preferred maximum amplitude of VH, the highest potential supplied to the memory chip. CP1 may correspond substantially in time to a Chip Select command signal, not shown, provided by the host system to the memory chip to initiate a memory cycle. The input information signal provided by Source 16 is required to be in a stable condition for the entire duration of the high level of CP1. Because T6 and T7 act as isolation gates between the chip and external circuits, the input signal may change at any time after CP1 falls. The restore pulse R is normally high during the time that the memory chip is not being accessed. Restore pulse R is normally distributed to many additional memory and peripheral circuits, but may also be provided only to the output signal buffers.

In order to describe the operation of the circuit, reference is made to FIGS. 1 and 2. Initially, at time $t0$, all of the clock pulses CP are down and restore pulse R is high turning on T1, T2, T8 and T12 restoring nodes N1, N2, N4 and N5 to a predetermined potential $+V$, assuming that $+V$ is less than threshold below VH, the potential of R. Since CP1 is low, i.e., at ground potential, T6 and T7 are off isolating the chip pads 18 and 20 from nodes N1 and N2, respectively. Boosting capacitors C1 and C2 are charged, as CP2 is low. In addition, bootstrap capacitors C3 and C4 are charged, as CP4 is low and T16 and T15 clamp the output terminals $\overline{DATA'}$ and DATA' to ground. T5 is off allowing node N3 to charge to $+V$ minus one threshold drop, or $+V-Vt1$. At time $t1$ restore pulse R falls, leaving all previously charged nodes in their charged stage, and CP1 rises to VH turning on T6 and T7. The time between $t1$ and $t2$ is sufficiently long to allow nodes N1 and N2 to be charged or discharged to assume the potentials applied on chip pads 13 and 20. Since Cin is considerably larger than C5, Cin acts as a voltage source and the input information signal potential appears on node N1. Vref is applied in a smaller manner to node N2.

For purposes of example, assume that the FET thresholds are 1.0 volts and that Data Signal Source 16 provides 0.8 volts for a high level, or logical one, and 0.0 volts for a low level, or logical zero. As previously described Vref should then be 0.4 volts. Assuming that $+V$ is greater than 0.8 volts, node N1 will discharge to 0.8 volts and node N2 will discharge to 0.4 volts, a differential of 0.4 volts. Note that neither of nodes N1 or N2 are above the threshold of T3 or T4. Under such conditions the latch comprising T3, T4 and T5 cannot be set without C1 and C2 since when CP2 goes high turning on T5, node N3 will be discharged to ground but will not be greater than one threshold voltage (1.0 volts) below that of the potentials on the gates either T3 or T4. Thus, neither T3 nor T4 will become conductive and the potentials on nodes N1 and N2 will both remain below the threshold level of T10 and T14 causing both data outputs to be driven high at the same time. At $t2$ time CP1 goes low turning off T6 and T7 again isolating nodes N1 and N2 from chip pads 18 and 20. At the same time ($t2$) CP2 rises driving the previously grounded plate of capacitors C1 and C2 and the gate of T5 positive. The increasing potential of CP2 simultaneously causes nodes N1 and N2 to rise by capacitive coupling through C1 and C2 and turns on T5 causing node N3, coupled to the sources of T3 and T4, to begin to discharge towards ground. Those skilled in the art will realize that the parasitic capacitance of C5 and C6 are non-linear due to the voltage variable characteristics of the FET source/drain diffusions making up C5 and C6.

The size of C1 and C2 is chosen to provide a sufficient potential increase, under worse case conditions when the input signal is 0.0 volts, to boost the 0.4 volts reference potential on node N2 sufficiently above threshold to cause T3 to turn on and to provide sufficient drive to cause T14 to turn on fully. In the instant example it was assumed that node N1 was charged to 0.8 and node N2 to 0.4 volts. The occurrence of CP2 causes both nodes to be boosted such that the difference between the higher node potential (N1) in combination with the falling of node N3 causes T4 to turn on and begin discharging node N2 through T4 and T5 to ground keeping T3 off. The time between $t2$ and $t3$ is selected to be sufficient to cause the lower of nodes N1 or N2 to be discharged to a potential less than one threshold. At $t3$ time CP3 rises to VH causing T9 and T13 to turn on. Since node N2 was assumed to be discharged T14 remains off blocking any substantial discharging of precharged node N5. Node N1 causes T10 to turn on such that when T9 becomes conductive precharged node N4 starts to discharge through T9 and T10 towards ground. At time $t4$, after node N4 has been discharged, CP4 rises to VH, T15 turns on and bootstraps the DATA' output terminal to charge load capacitance CL to VH. T14 remains non-conductive as its gate was previously discharged. At time $t5$ CP2 and CP3 return to ground. Note that as CP2 falls node N2, already at ground potential will be coupled negatively tending to forward bias the drain of T4, a potentially undesirable situation. As node N2 falls, however, T2, having its drain at $+V$ and its gate at ground at this time, will turn on when node N2 reaches a threshold below ground and will clamp node N2 to this potential. Assuming that a negative substance bias in excess of one threshold voltage is used to stabilize device thresolds, bipolar injection will be avoided. At time $t6$, CP4 returns to ground and, since node N5 is still high, the output load CL is discharged pulling output terminal DATA' to ground. Restore pulse R rises at time $t7$ again precharging nodes N1, N2, N4 and N5 preparing the circuit for the next memory cycle.

If the initial input conditions are such that the input signal is at its low level, 0.0 volts, nodes N1 and N2 will be discharged to 0.0 and 0.4 volts, respectively, between $t1$ and $t2$ allowing node N5 to discharge before CP4 rises such that the $\overline{DATA'}$ output terminal will be driven to VH by CP4.

One of the advantages of the present circuit is that if the input signals provided by Data Signal Source 16 have high levels in excess of a threshold the circuit operates in the same manner as when input signals are below threshold. Note also that if the low level input signal has a worse case most positive down level greater than a threshold, only Vref need be charged for proper operation of the circuit.

Those skilled in the art will recognize that various changes or modifications of the circuit may be made without effecting the basic operation of the circuit. For example, other types of output drivers may be used, such as a source follower responsive to CP4, providing that certain modifications are made to insure that capacitors C1 and C2 are not required to be necessarily large. The precharge potential $+V$ for nodes N1 and N2 may be selected to be nearer Vref, or even at Vref, in order to increase the speed at which nodes N1 and N2 are stabilized. For example, if $+V$ equals Vref, node N2 will experience no change during the time betwen $t1$ and $t2$ and node N1 will be either discharged or charged to the level of the input signal. In addition, the timing of the boosting of nodes N1 and N2 by C1 and C2 need not be simultaneous with the setting of the latch via T5, but may precede it at the expense of providing an additional clock pulse edge between times t2, when nodes N1 and N2 are boosted, and t3, when the latch is required to be set.

In order to insure proper operation of the buffer circuit it is important to establish nodes N1 and N2 at the same potential prior to the gating of the input and eference potentials to these nodes.

Although the invention has been described in terms of a single embodiment thereof, it will be understood by those skilled in the art that various changes in form nd details may be made therein without departing from the spirit and scope of the invention.

What is claimed is:

1. An input signal buffering circuit comprising:
   first and second input/output voltage nodes;
   regenerative latch means coupled to said input/output voltage nodes for providing logical output signals on said input/output voltage nodes in response to the application of differential potentials to said nodes only on the condition that the potential of at least one of said voltage nodes exceeds a predetermined potential;
   input signal source means for applying first and second input signal potentials to said first and second voltage nodes during a first clock period, the maximum magnitude of said first and second input signal potentials being insufficient to render said regenerative latch responsive; and
   capacitive coupling means coupled to said voltage nodes for independently increasing the magnitude of the potentials applied to said first and second voltage nodes after the application of said signal potentials and during a second time period to cause said regenerative latch means to provide logical output signals.

2. The input signal buffering circuit of claim 1 wherein said input signal source means comprises: a source of reference potential for providing said first signal potential, a source of digital logic potentials for providing said second signal potential and gating means for applying said source of reference potential and said source of digital logic potentials to said first and second input/output voltage nodes.

3. The input signal buffering circuit of claim 2 wherein said regenerative latching means and said gating means comprise field effect transistors.

4. The input signal buffering circuit of claim 3 wherein said source of digital logic potentials is a bipolar transistor logic circuit.

5. The input signal buffering circuit of claim 1 wherein said capacitive coupling means comprises first and second capacitances coupled to a common pulse source.

6. The input signal buffering circuit of claim 1 further including precharging means for precharging said first and second voltage nodes to substantially equal potentials prior to providing said first and second signal potentials to said first and second voltage nodes.

7. The input signal buffering circuit of claim 1 further comprising first and second output driver circuits coupled to said first and second voltage nodes for providing true and complementary output signals in response to the logical output signals of said regenerative latch means.

8. The input signal buffering circuit of claim 7 wherein said output drivers are dynamic field effect transistor logic circuits.

9. An input signal buffering circuit for converting low level bipolar transistor logic signals to high level field effect transistor logic signals comprising:
   first and second voltage nodes;
   first and second field effect transistors, each having source, drain and gate electrodes and a predetermined conduction threshold voltage, the drain of said first transistor being coupled to the gate of said second transistor and to said first voltage node, the drain of said second transistor being coupled to the gate of said first transistor and to said second voltage node, and the source electrodes being common and comprising a third voltage node;
   a source of low level bipolar transistor logic signals, said low level bipolar transistor logic signals having a maximum amplitude less than said predetermined conduction threshold voltage;
   a third field effect transistor for applying said logic signals to said first voltage node in response to a first clock pulse, said third field effect transistor coupled between said source of low level bipolar transistor logic signals and said first voltage node;
   a source of first reference potential, said first reference potential having a magnitude lower than the maximum potential of said low level bipolar transistor logic signals;
   a fourth field effect transistor for applying said first reference potential to said second voltage node in response to said first clock pulse, said fourth field effect transistor coupled between said source of first reference potential and said second voltage node;
   clock responsive capacitive coupling means coupled to each of said first and second voltage nodes for providing substantially equal increases in the magnitude of the potentials on said first and second voltage nodes in response to a second clock pulse following said first clock pulse;
   a second source of reference potential; and
   a fifth field effect transistor, coupled between said third voltage node and said second source of reference potential, for causing at least one of said first and second transistors to become conductive after the commencement of said second clock pulse.

10. The input signal buffering circuit of claim 9 wherein said fifth field effect transistor is rendered conductive in response to said second clock pulse.

11. The input signal buffering circuit of claim 10 further comprising sixth and seventh field effect transistor means responsive to a restore clock pulse prior to said first clock pulse for applying equal predetermined precharge potentials to said first and second voltage nodes.

12. The input signal buffering circuit of claim 11 wherein said predetermined precharge potential equals said first reference potential.

13. An input buffer circuit having first and second supply terminals, first, second and third clock signal terminals, a data input terminal and a reference voltage input terminal and including a cross-coupled dynanic latch circuit for providing complementary field effect transistor logic level output signals on first and second voltage nodes, the improvement comprising:
   first gating means, coupled to said data input terminal, to said first voltage node and to said first clock signal terminal, for applying an input signal to said first voltage node in response to a first clock signal;

second gating means, coupled to said reference voltage terminal, to said second voltage node and to said first clock signal terminal, for applying a reference signal to said second voltage node in response to said first clock signal;

capacitive coupling means coupled to said first voltage node, to said second voltage node and to said second clock signal terminal, for independently coupling a change in voltage at said second clock signal terminal in each of said first and second voltage nodes in response to a second clock signal following said first clock signal; and precharging means coupled to said first and second voltage nodes, to said first supply terminal and to said third clock signal terminal for equalizing the potential on said first and second voltage nodes in response to a third clock signal.

14. The input buffer circuit of claim 13 wherein said first and second gating means comprise first and second field effect transistor means, respectively, each transistor having a gate electrode coupled to said first clock signal terminal.

15. The input buffer circuit of claim 14 wherein said cross-coupled dynamic latch circuit comprises third and fourth field effect transistors coupled to said first and second voltage nodes, each of said transistors having a current conducting electrode coupled in common to a third voltage node, a fifth field effect transistor, coupled to said third voltage node, to said second clock signal terminal and to said second supply terminal, for coupling said third voltage node to said second supply terminal in response to a second clock signal.

16. The input buffer circuit of claim 15 wherein said precharging means comprises sixth and seventh field effect transistor means.

17. The method of translating a bipolar transistor logic circuit input signal level to complementary field effect transistor logic output signal levels, comprising the steps of:

providing a cross-coupled field effect transistor latch circuit means responsive to differential potentials on first and second voltage nodes only when the potential of at least one of said voltage nodes is in exces of a threshold voltage;

establishing and isolating a predetermined reference potential on at least a first one of said voltage nodes;

applying and isolating said bipolar transistor logic circuit input signal on the other of said voltage nodes, said input signal being of smaller maximum magnitude than the threshold voltage to which said latch circuit is responsive and of larger magnitude than said reference potential;

capacitively coupling a clock signal to said first and second voltage nodes to independently provide an increase in magnitude of the potentials on said voltage nodes sufficient to render said latch circuit responsive to said increased potentials and sufficient to allow the potentials on said voltage nodes to be utilized as field effect transistor logic level output signals; and sensing the potential levels on said first and second voltage nodes as complementary field effect logic output signal levels.

18. The method of claim 17 wherein said steps of establishing a predetermined potential on at least a first one of said voltage nodes and applying said bipolar logic circuit input signal occur substantially simultaneously.

19. The method of claim 18 wherein the steps of capacitively coupling a clock signal to said first and second voltage nodes and sensing the potential levels on said first and second voltage nodes occur substantially simultaneously.

* * * * *